United States Patent [19]

Beratan et al.

[11] Patent Number: 5,016,063
[45] Date of Patent: May 14, 1991

[54] MOLECULAR IMPLEMENTATION OF MOLECULAR SHIFT REGISTER MEMORIES

[75] Inventors: David N. Beratan, South Pasadena, Calif.; Jose N. Onuchic, Sao Carlos, Brazil

[73] Assignee: The United States of America as represented by the Administrator of the National Aeronautics and Space Administration, Washington, D.C.

[21] Appl. No.: 393,176

[22] Filed: Aug. 14, 1989

[51] Int. Cl.$^5$ .............................................. H01L 29/28
[52] U.S. Cl. ........................................ 357/8; 350/354; 357/30
[58] Field of Search ...................... 357/8, 30 R; 437/1; 350/354; 365/106, 112

[56] References Cited

U.S. PATENT DOCUMENTS

3,953,874  4/1976  Aviram et al. ............................ 357/8
4,574,161  3/1986  Marks ................................. 357/8 X Primary Examiner—Andrew J. James
Assistant Examiner—Sara W. Crane
Attorney, Agent, or Firm—Thomas H. Jones; Harold W. Adams; John R. Manning

[57] ABSTRACT

An electronic shift register memory (20) at the molecular level is described. The memory elements are based on a chain of electron transfer molecules (22) and the information is shifted by photoinduced (26) electron transfer reactions. Thus, multi-step sequences of charge transfer reactions are used to move charge with high efficiency down a molecular chain. The device integrates compositions of the invention onto a VLSI substrate (36), providing an example of a "molecular electronic device" which may be fabricated. Three energy level schemes, molecular implementation of these schemes, optical excitation strategies, charge amplification strategies, and error correction strategies are described.

22 Claims, 5 Drawing Sheets

MOLECULAR IMPLEMENTATION OF MOLECULAR SHIFT REGISTER MEMORIES

ORIGIN OF THE INVENTION

The invention described herein was made in the performance of work under a NASA contract, and is subject to the provisions of Public Law 96-517 (35 U.S.C. 202) in which the Contractor has elected not to retain title.

CROSS-REFERENCE TO RELATED APPLICATION

The present invention is related to Ser. No. 07/221,021, filed July 18, 1988, which discloses and claims molecular shift registers based on electron transfer and methods of transferring electrons in such shift registers.

TECHNICAL FIELD

The invention relates to molecular shift register employing an electron transfer mechanism, and, more particularly, to molecular systems for the implementation of such shift registers.

BACKGROUND ART

Man-made computing devices at the molecular level have been described in the prior art. In the prior art, the basic computing elements are individual molecules or assemblies of active groups on the scale of 10 to 50 Å. The "state" of such a molecular element is changed by altering the conformation of a given molecule, or by the addition (or subtraction) of an electron or a small chemical group.

There are several chief motivating ideas behind this literature. First, since molecular computation takes place (molecular biology is really a form of computation at the molecular level), it might be possible to build "electronic" or non-biological computational devices at the molecular level. Second, at the molecular level, one can understand how to build "p-n junctions", "photo-junctions", "wires", and even "field-effect transistors"; thus, all the essential elements of VLSI (very large scale integration) technology appear to be present on the molecular scale. Third, both the realities of molecular biology and the theory of computation explain how to do essentially error-free computation with error-prone or erroneously constructed devices. Thus, the inevitable errors of construction, and the "noise" and errors which will be present when the size of computing energies is decreased towards $\sim 50$ kT per decision (instead of the present $\sim 10^6$ kT per decision), need not in principle cause errors in the overall computation done by such devices. These ideas suggest building a molecularly based chip having a device density thousands of times larger than conventional VLSI (very large scale integrated) chips.

While molecular shift registers based on electron transfer have been disclosed and claimed in the above-mentioned Ser. No. 07/221,021, molecular systems for the implementation of such shift registers is required.

STATEMENT OF THE INVENTION

Accordingly, it is an object of the invention to provide molecular systems useful in the construction of molecular shift registers.

It is also an object of the invention to provide, by using multi-step sequences of charge transfer reactions, means of moving charge with high efficiency down a molecular chain.

In accordance with the invention, molecular systems useful in molecular device shift registers employing electron transfer mechanism are provided. The electronic shift register comprises a plurality of molecular devices formed on a semiconductor substrate which also supports a VLSI circuit, to which the molecular devices are electrically and logically connected. The molecular devices comprise a polymer made up of a plurality of monomeric repeat units, with each monomeric repeat unit comprising at least three different monomers. The first repeat unit is termed the donor, the last repeat unit is termed the acceptor, and the repeat unit(s) between the first and last repeat units are termed the intermediate(s).

One of the monomers in each repeat unit is characterized by a ground state and an upper state to which electrons (or holes) may be excited, while the remaining monomers in each repeat unit have ground state energy levels which can donate (or accept) charge to (or from) the excited repeat unit. Excited states can be described as states in which electron(s) are promoted to higher lying molecular orbitals or hole(s) are promoted to lower lying molecular orbitals. The device is activated by light having the appropriate wavelength to excite electrons (or holes) to a higher energy level.

There are three categories in which devices may be classified: (1) whether information is written with holes or electrons; (2) whether the donor, intermediate, or acceptor is initially excited by the light; and (3) whether the molecular orbitals are predominantly filled with electrons or empty. Polymeric compositions may be constructed based on combinations of the three foregoing elements; there are twelve such possible combinations.

Methods are provided for increasing the efficiency of molecular shift register. Efficient transfer of an electron from one repeat unit to the next is increased by tuning the positions of the energy levels or the coupling between energy levels to make the forward transfer rate fast and the recombination rate slow. Such tuning is accomplished by derivatizing any of the donor, intermediate, or acceptor monomers and/or by providing bridging (linking) groups between any of the donor, intermediate, and acceptor monomers within the repeat unit or between repeat units.

Another way to increase efficiency is to construct a repeat unit having at least four monomers, including donor and acceptor monomers and at least two intermediate monomers. In this configuration, both the donor monomer and the intermediate monomer adjacent the acceptor monomer have two energy levels, with the upper state of one monomer different than the upper state of the other monomer. The transfer of electrons is effected by exciting the polymer at a first wavelength, then exciting the polymer at a second wavelength, then repeating the alternating excitation. Of course, it will be appreciated that more than two monomers with two energy levels may be employed, with a concomitant increase in the number of wavelengths needed for excitation and transfer.

BRIEF DESCRIPTION OF THE DRAWINGS

FIG. 2b depicts the one-electron energy levels of each monomeric unit of the polymer of FIG. 2a;

FIG. 3b illustrates a molecular system having the energy levels depicted in FIG. 3a;

FIG. 4b illustrates a molecular system having the energy levels depicted in FIG. 4a;

FIG. 5b illustrates a molecular system having the energy levels depicted in FIG. 5a;

DETAILED DESCRIPTION OF THE INVENTION

Figure 1A:
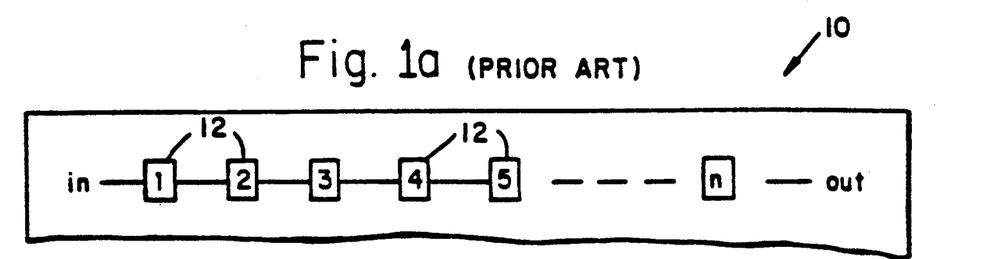
FIG. 1a is a schematic diagram of a shift register of the prior art.

A shift register 10 is a form of memory. In concept, it consists of a set of memory cells 12 connected in a line (FIG. 1a). Each cell stores one bit of information. During each clock cycle, the contents of each cell is shifted to the next register to the right. The first register 1 receives a new bit of information to be stored, while the bit which was in the last register n is transferred to the external circuit.

Figure 1B:
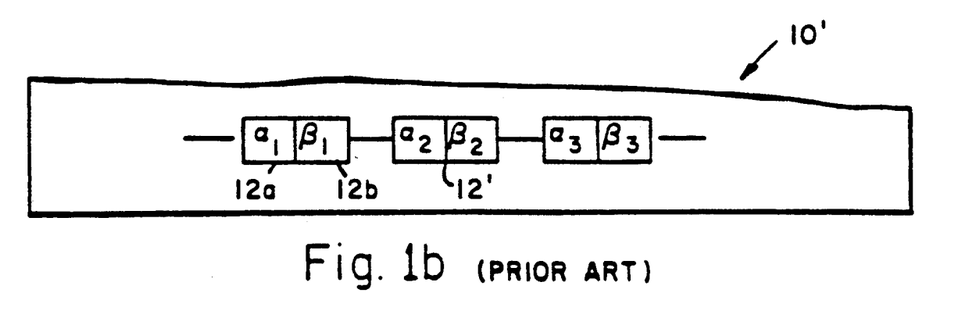
FIG. 1b is a schematic diagram of an electronic shift register of the prior art.

Electronic shift registers 10' generally involve two information storage sites (12a, 12b) in a single cell 12, (FIG. 1b). Toward the end of a clock cycle, the state of the right half ($\beta_1$) of each cell is the information stored. The early part of the next clock cycle copies the bit in $\beta_1$ into $\alpha_1+1$, the left hand half of the next cell. The latter part of the clock cycle moves the bit from each $\alpha_1$ into $\beta_1$. By separating the operation into two parts, reliable copies of the information can be copied without confusion. Electronic shift registers 10' are in commercial use as circuit elements for a variety of time-delay and information storage uses. Magnetic bubble memories are a form of shift register.

In the molecular shift register device disclosed in Ser. No. 07/221,021, referred to above, a physical hybrid, comprising a plurality of molecular devices (described below) and a silicon VLSI-style circuit, on which the molecular devices are built, is provided. The silicon circuit provides the means of making electronic and logical contact, with a molecular structure comprising the molecular devices added thereto. The base silicon chip has various metal and oxide parts exposed, and can be fabricated with 1 $\mu$m-scale lithography. Appropriate surface treatments with appropriately designed molecular solutions and electrochemistry can generate a functional chip in which the dominant computation is done by the added molecular devices.

Employing a physical hybrid between the device of the invention and a VLSI-style circuit poses a number of potential problems. These include (1) the means of delivering the energy needed for the computation to the molecules, (2) delivery of the clock signal to the device, (3) fabrication of the molecular device, (4) communicating the molecular information with the micrometer size features of the chip, and (5) dealing with errors.

All of the foregoing problems may be addressed by using molecular electron transfer reactions as the fundamental computing element. Such reactions are desirable because they involve no bond formation or breakage, are reversible, have tunable rates, have an intrinsic directionality and a natural means of connecting the clock with the energy source (e.g., a light pulse).

Figure 2A:
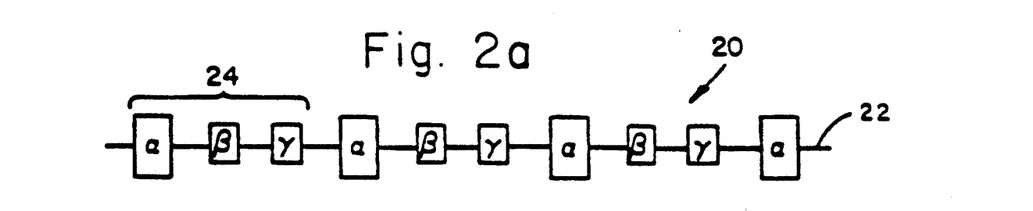
FIG. 2a depicts schematically an example of a polymer suitably employed in the invention, using a three-monomer repeat unit.
Figure 2B:
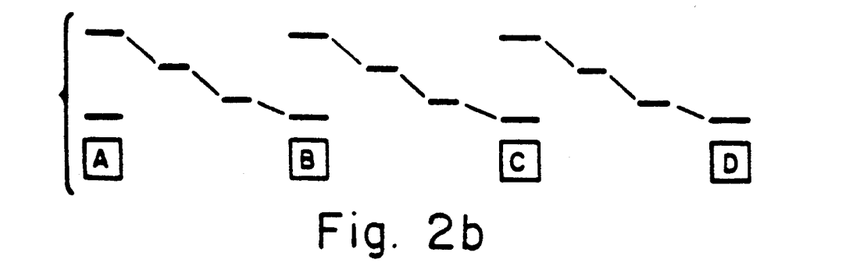

A molecular electronic shift register 20 can be made as in FIG. 2. An $\alpha\beta\gamma\alpha\beta\gamma\alpha\beta\gamma$ polymer 22 is prepared, as shown in FIG. 2a. FIG. 2b shows the one-electron levels of the units $\alpha,\beta,\gamma,\alpha,\beta,\gamma$, . . . For operational purposes, molecular subunits $\beta$ and $\gamma$ have no relevant excited states, and are represented by single energy levels. The units $\alpha$ have two energy levels: a ground state and an upper state to which they can be excited by light.

Each polymer chain 22 comprises a plurality of monomeric repeat units 24, each monomeric repeat unit comprising at least three monomers. In FIG. 2a, three such monomers, $\alpha$, $\beta$, and $\gamma$ are shown. The first monomer in the unit ($\alpha$) is called the donor, while the last monomer in the unit ($\gamma$) is called the acceptor. In between, there may be one or more intermediate monomers ($\beta$).

There are at least three design categories which may be used to classify devices having these properties. The category is defined by the answers to the following questions: (1) Is the information written with electrons or holes? (2) Is the donor, intermediate, or acceptor initially excited by the light? (3) Are the molecular orbitals predominantly filled with electrons or vacant?

Selection of one particular scheme over another will dictate whether information will be written by oxidizing or reducing the terminal group in the chain. Also, details of the repeat unit structure will determine whether information moves from left to right or right to left in the device.

Real molecules with any combination of answers will make useful devices. There are twelve such possible combinations.

While there may be many possible permutations of the above characteristics which would lead to an acceptable device, however, there are three distinct implementations, each with a corresponding real material. These three implementations are chosen only because specific realizations of the schemes could be written down based on known (simpler) electron transfer reactions in the literature. Other implementation schemes would be conceptually closely related to the three given, and it is not clear that a simple implementation could be proposed at the present time. Nevertheless, such other schemes, based on the teachings herein, are also deemed to fall within the scope of this invention.

Figure 3A:
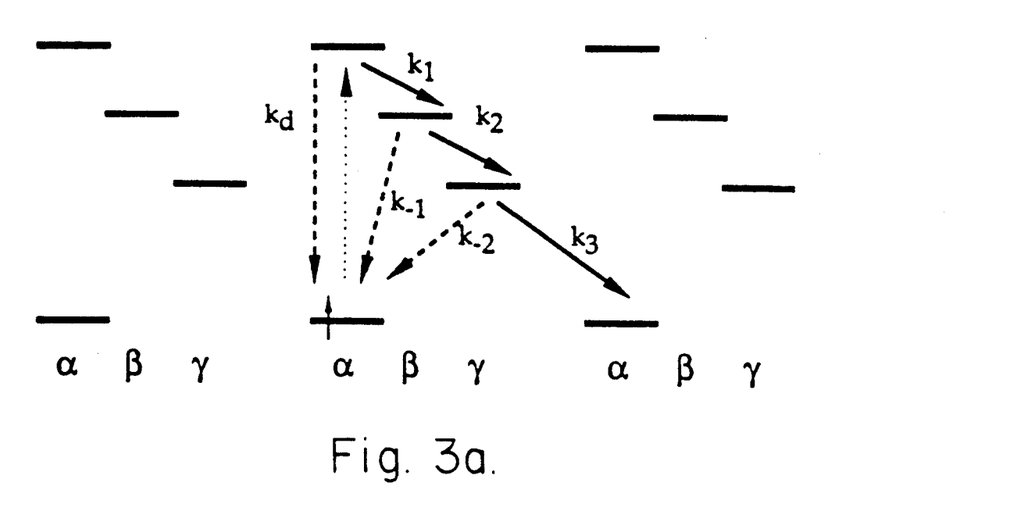
FIG. 3a depicts the energy levels of one embodiment of a molecular system in accordance with the invention.
Figure 3B:
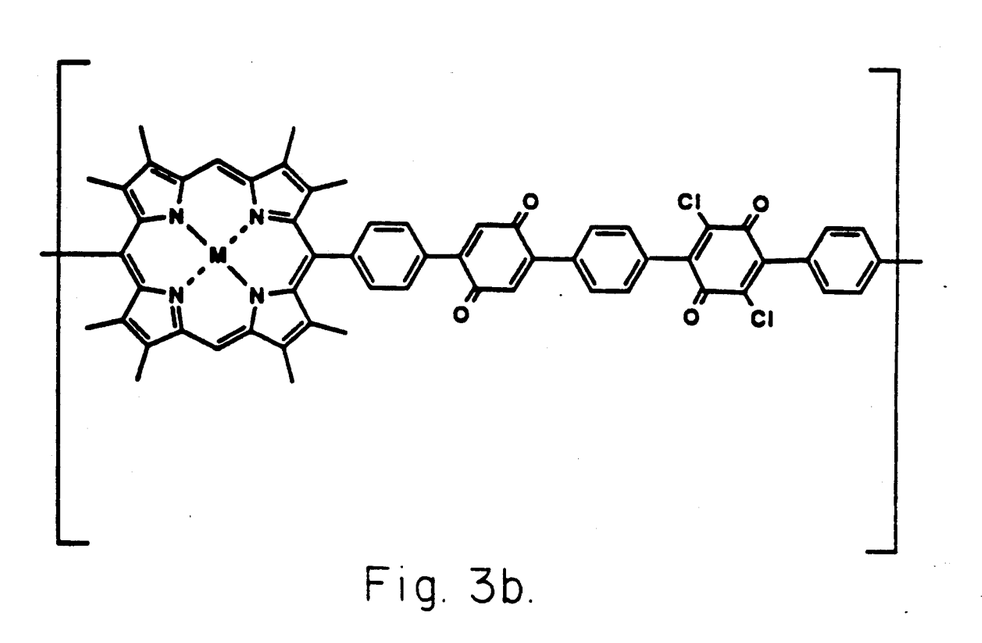
Figure 4A:
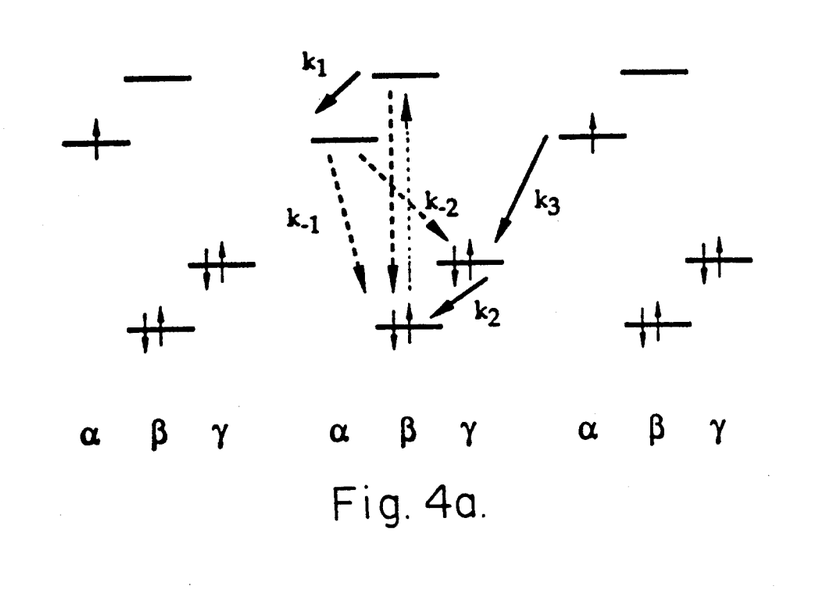
FIG. 4a depicts the energy levels of another embodiment of a molecular system in accordance with the invention.
Figure 4B:
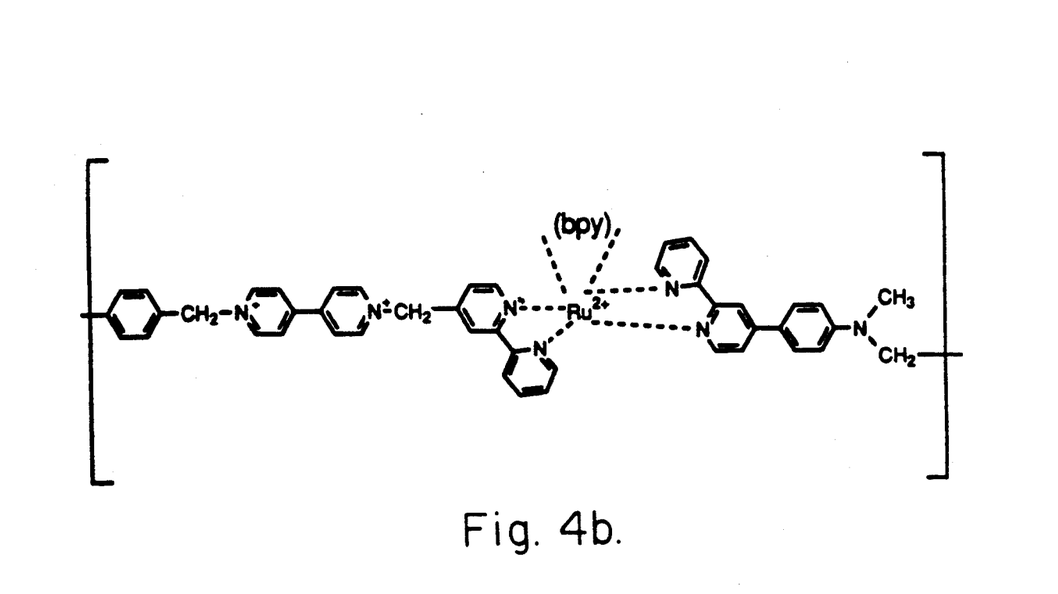
Figure 5A:
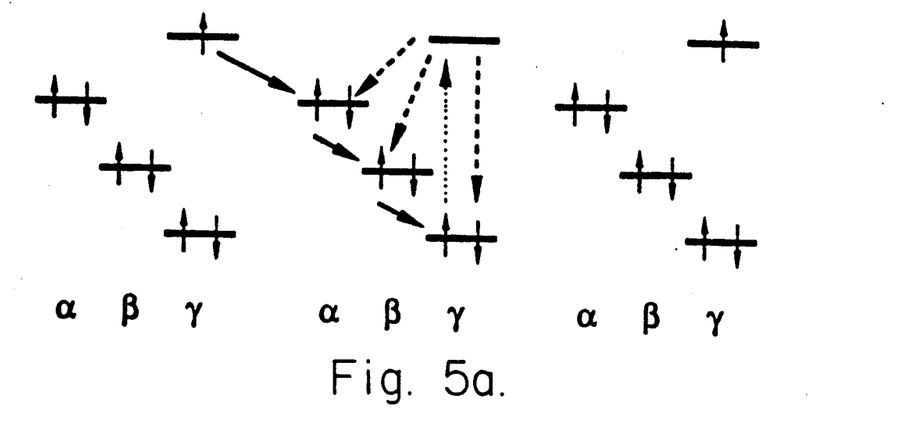
FIG. 5a depicts the energy levels of yet another embodiment of a molecular system in accordance with the invention.
Figure 5B:
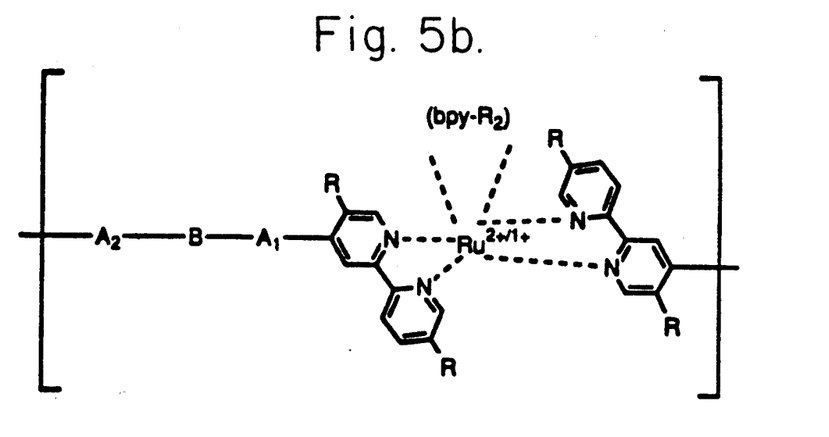
Figure 6:
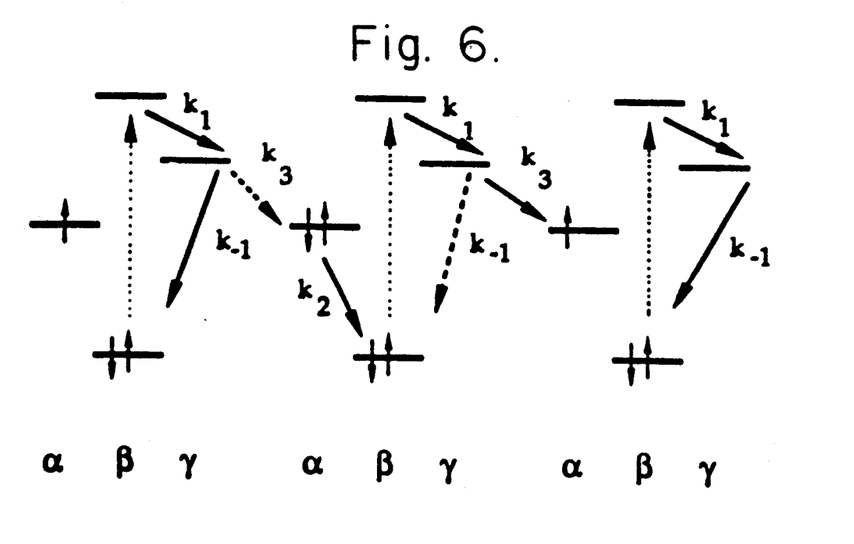
FIG. 6 depicts the energy levels of still another embodiment of a molecular system in accordance with the invention.

The orbital schemes for each implementation are depicted in FIGS. 3a, 4a, and 5a. In all cases, three repeat units in the polymer are shown. The sequence "010" is represented in these diagrams. The corresponding molecules are shown in FIGS. 3b, 4b, and 5b, respectively. FIG. 6 depicts an orbital scheme for which a real molecular implementation has not yet been found, but which is expected to fully function as a molecular shift register.

In the energy level schemes depicted in FIGS. 3a, 4a, and 5a, the presence of a "1" in the second cell, or repeat unit, is represented by the presence of an electron (small up arrow). Each accessible energy level in the Figures is represented with a horizontal bar. Due to the Pauli exclusion principle, each such level can contain 0, 1, or 2 (but not more) electrons. Electrons are represented by the small straight vertical arrows. Electrons and holes are complementary. If two electrons (arrows) are present, no holes are present. If one electron (arrow) is present in an energy level, one hole is also present in that level. If there are no electrons in a given level, then two holes are present.

As noted above, complete filling of an energy level is represented by a pair of small up and down arrows. The dotted line represents excitation of that cell by light. Solid lines show the transfer reactions which shift the electron one unit down the chain following photoexcitation. Back reactions which decrease the efficiency of the device are shown with dashed arrows. The relative energies of the orbitals are indicated by their vertical position.

The generic requirements for proper function in systems like the one in FIG. 3a include (1) forward transfer from the excited donor must be much faster than the corresponding radiative plus non-radiative decay to the ground state ($k_1 >> k_d$); (2) all forward transfers must be faster than reverse transfers ($k_2 >> k_1$ and $k_3 >> k_{-2}$); (3) electron transfer from the excited state to the next cell ($k_1$) must be much faster than the recombination rate ($k_{-2}$) to avoid a bottleneck at the connection between cells. (Similar systems with more intermediate states might also be used.) The three requirements are generic, although the relations for the particular k's depend on the exact energy level scheme. The relationship for the particular k's shown are appropriate for the scheme depicted in FIG. 3, as is mentioned.

Intermediates are an important component of the scheme for achieving high efficiency charge transfer. The intermediate serves to (1) rapidly quench the excited state and (2) provide a large distance between the transferred electron and the molecule on which it originated. This yields a long lived charge separated state and more efficient shifting of charge between adjacent repeat units of the polymer.

The scheme in FIGS. 3a, 3b writes the information as electrons in a chain of mostly unoccupied orbitals. The shift is accomplished by donor excitation. The porphyrinquinone(1)- quinone(2) chain is used, with porphyrin as the donor, quinone(1) as the intermediate, and quinone(2) as the acceptor. The rate could be tuned by altering the nature of the linking units, for example, by adding the rigid saturated spacer bicyclo[2.2.2]octane unit. The spacer group could be placed between the porphyrin and quinone(1); and/or between quinone(1) and quinone(2); and/or between quinone(2) and the porphyrin of the next unit in the chain.

M in the porphyrin could be Zn or Pd, for example. Zn and Pd are chosen because (1) they are stable in both the +2 and +3 oxidation states when bound to a porphyrin and (2) they have a large spin-orbit coupling so that the yield of triplet excited states, from which the electron transfer may be desired, is very large. Numerous other metallo-porphyrins would also probably fit these requirements, as would many phthallocyanins, which have a related ring structure. Such other compounds are also contemplated by the invention.

By altering the metal, the lifetime of the excited donor state can be tuned to optimize the quantum yield for electron transfer. Electron transfer reactions have strong (exponential) dependencies on (1) the "driving force" (or exothermicity) of the reaction and (2) the strength of the coupling between donor and acceptor. The exothermicity of the transfer reaction can be modified by changing the metal in the porphyrin as well as by substituting electron donating or withdrawing groups on the donors or acceptors. The coupling can be modified by changing the positions at which the rings are linked together, or by introducing additional spacer groups, such as bicyclo[2.2.2]octane.

FIGS. 4a and 4b show the system in which a "1" is written with a hole in a system of predominantly filled orbitals. The electron shift follows excitation of the intermediate. In FIG. 4a, the intermediate is labeled "beta" ($\beta$), the donor is labeled "gamma" ($\gamma$), and the acceptor is labeled "alpha" ($\alpha$). In FIG. 4b, ruthenium tris(2,2'-bipyridine) is the intermediate, dimethyl aniline is the donor, and methyl viologen is the acceptor. This system is distinct from the previous example because of the use of a transition metal-based intermediate group, which is photo-excited. The rates of electron transfer can be tuned by changing the ligands on the metal (2,2'-bipyridine; other pyridine ligands may also be used), by altering the spacers, or by adding other substituents to the aromatic amine or methyl viologen.

In FIGS. 5a and 5b are the analogs of FIG. 3, using instead predominantly filled electronic levels. The acceptor level in this case is photoexcited. In FIG. 5a, the intermediate is labeled "beta", the donor is labeled "alpha", and the acceptor is labeled "gamma". In FIG. 5b, the ruthenium complex is the intermediate, $A_2$ is the donor, and $A_1$ is the acceptor. A linker group B, between $A_2$ and $A_1$, is provided. In this example, the R group on the organic rings is $CO(OCH(CH_3)_2)$.

Two possible molecules are based on different sets of aromatic amines and a transition metal complex, here, the ruthenium complex shown. $A_1$ and $A_2$ are separate aromatic amine or diamine derivatives. In one case, $A_1$ is p-methyl dimethylaniline and $A_2$ is N,N,N'N'-tetramethylbenzidine; in another case, $A_1$ is N,N,N'N'-tetramethylbenzidine and $A_2$ is N,N,N'N'-tetramethylphenylenediamine. The sets of amines are chosen to have appropriate redox potentials with respect to the Ru to properly separate the charge. The relative values of the redox potentials are indicated by the positions of the energy levels for the states (because of sign conventions, redox potentials have the opposite sign from the orbital energy levels). Only the relative energies are important here; the precise values of the redox potentials vary with the R groups actually used. The bridge (B) could be an aromatic, saturated, or mixed group; examples include phenyl and methylene.

In FIG. 6 is shown an example similar to that of FIG. 4. As in FIG. 4, the intermediate group is excited. However, the information in FIG. 6 is transferred as an electron, not as a hole.

The particular monomers given as examples herein should be considered as exemplary only; it is expected that other monomers having the requisite properties taught herein may be used in the practice of the invention. The R groups are those commonly used in organic chemistry, and include halogens, alkyl chains, ketones, esters, acids, and the like. Selection of particular R groups to provide specific properties to the polymer, e.g., tuning the many rates of electron transfer in the polymer to get maximum efficiency for the device, is within the ability of those skilled in this art, based on the teachings herein. Similarly, the presence or absence of linker groups and their position on the polymer is dictated by the particular properties of the device desired.

In this connection, the positions of the energy levels or coupling between energy levels may be tuned to make the forward transfer rate fast and the recombination rate slow. Such tuning may be accomplished by derivatizing any of the donor, acceptor, and intermediate monomers and by the use of linker groups, whether between any of the donor, acceptor, and intermediate monomers, within the repeat unit or between repeat units.

In each of the foregoing examples, a "1" (or "0") is written by reducing (or not reducing) the first repeat unit in the chain which would be in contact with a first electrode (described more fully below). Exposing the chain to short intense bursts of light shifts the written state one repeat unit to the right, provided that the processes indicated with solid arrows are much faster than their competing processes indicated with dashed arrows. The potential of the electrode determines whether a 1 or 0 is written into the shift register during a given light flash.

The device for which the molecular systems are provided uses periodic light pulses both to provide the power and to be the synchronizing clock signal. Electrons are collected at a second electrode at the terminus of the chain.

Figure 7:
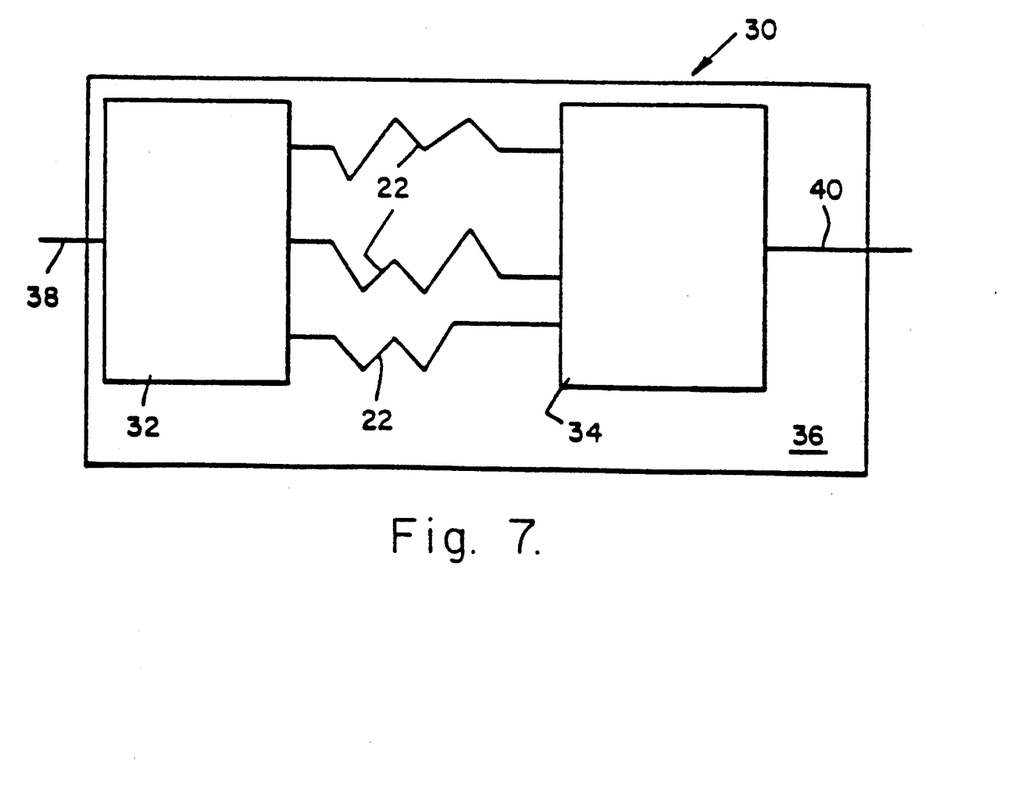
FIG. 7 is a schematic representation of a molecular device which employs the molecular systems of the invention.

A molecular circuit 30, shown in FIG. 7, is assembled by first binding the head end of about 5,000 polymer chains 22, each exactly 600 polymer units long, (600 being a typical value) to one edge of a metal (or doped semiconductor) conducting source electrode 32. This can be done by activating one such edge by a deposition using directional shadowing, and then using the activated area as an electrode to form a covalent bond with a group such as a silyl at the head end of the polymer chain. In a similar fashion, the tail of the exactly 600 unit polymer can be covalently linked to an edge of a similarly conducting receiving electrode 34.

Such an assembly of repeat units 24 would provide chains 22 of 1.2 μm (distance measured along the backbone), assuming that each repeat unit is 20 Å. If there are exactly 600 units 24 in each polymer 22, the precision of manufacturing is absolute, since the electrons move along the polymer paths, even though errors in lithography will produce rough edges of S and R, with local fluctuations of 1,000 Å.

The use of about 5,000 parallel chains 22 having the same information stored allow the detection of the electrons at the receiving electrode 34 without further amplification. This redundancy also serves the purpose of preserving the written information if some fraction of the chains is degraded or does not transfer the electrons at the proper moment.

Each such molecular circuit 30, comprising a plurality of polymeric strands 22, is supported on a substrate 36 and is connected to VLSI circuitry (not shown) by input connection 38 and output connection 40.

In operation, the material would be immersed in electrolyte, such as salt water or acetonitrile with TBAP (tetra-butyl ammonium perchlorate), and a third (reference) electrochemical electrode placed in the solution. The ionic strength of the electrolyte should be made adequate to keep the Debye length to ~20 Å. Every clock cycle, the system is excited by an intense short pulse of laser light.

A probability for excitation and electron transfer of 99.9% per cycle is required so that at least half of the electrons arrive at the $600^{th}$ site at the correct time. To achieve this with a donor having an extinction coefficient of $10^5$ $M^{-1}cm^{-1}$, a minimal energy flux of 20 millijoules/cm$^2$ per pulse is needed. A 1 cm$^2$ chip with a 1 MHz clock speed which stores $10^9$ bits dissipates only 1.5 watts because the electron transfer material is optically thin.

Such an efficiency of at least about 99.9% efficiency of charge transfer for each clock cycle may be achievable with simple excitation strategies. However, there are additional schemes which may be employed to relax this constraint on the device.

There are three characteristic time scales to consider. One is the time required to form the charge separated state following excitation (96 $_1$); the second is the lifetime of the charge separated state on an isolated monomer unit ($\tau_2$); and the third is the time for an electron (or hole) to transfer to an adjacent cell to achieve the shifting of the bit ($\tau_3$). The duration of the light pulse divided by $\tau_1$ is approximately equal to the number of attempts that the electron has to transfer. However, the duration of the light pulse must be short compared to the time for the electron to shift to/from the next cell so that each clock cycle moves the charge one unit down the chain. Thus, the "average" number of attempts to separate charge in a given cell can be made to be of the order of $\tau_3/\tau_1$ by selecting the duration of the light pulse ($\tau_2$ must also be long compared to $\tau_3$ for the entire scheme to work). Either the duration of the light pulse, or multiple flashes, may be used to optimize the yield. It will be noted that for the Ru systems, where the characteristic times are probably of the order of micro- to milliseconds, this strategy may be particularly rewarding. As an example of the importance of this strategy, consider making three attempts to charge transfer, each with a 90% chance of success. This produces a 99.9% net yield of charge separated states, as required.

Turning now to avoiding timing problems, it is possible that systems with adjacent strings of zeros or ones may suffer from synchronization problems. That is, shifting of the information string may require concerted effort of the electrons (or holes) in many units and may decrease the efficiency of a real device. One way to eliminate this problem entirely is to consistently write a zero (or a one, depending on how the information is carried) following each "real" writing step. This lowers the bit density, but solves the concerted motion problem.

Figure 8:
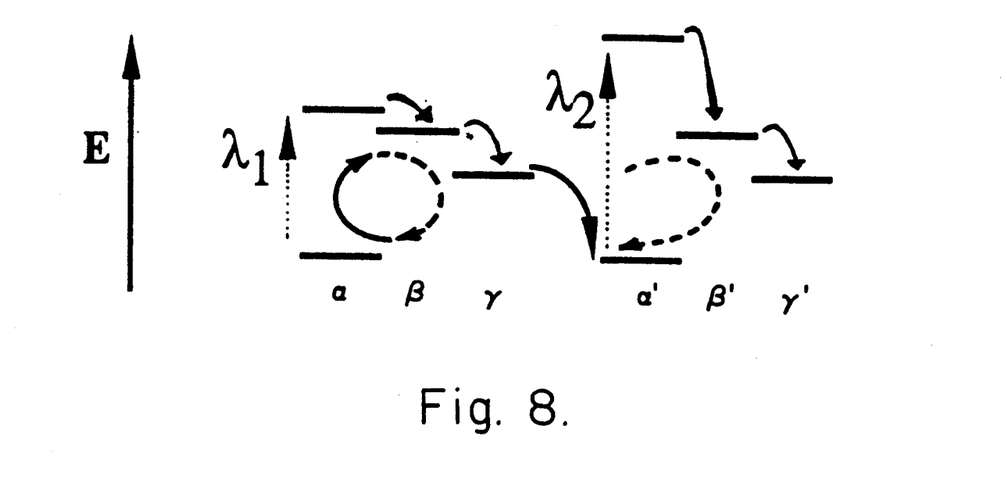
FIG. 8 is a schematic representation of a two phase clock scheme.

An additional way to avoid the timing and efficiency problems is to use a two phase clock. This means that shifting the bit down the chain one cell, or repeat unit, in the desired direction requires two sequential excitation pulses at wavelengths $\lambda_1$ and $\lambda_2$. Because both pulses are required to achieve charge shifting by one cell, the duration of the individual excitations may be made long without the problem of moving the bit more than one cell per light pulse. Such a two-phase excitation strategy will allow driving the bits unidirectionally with extremely high probability. This is because undesired recombination reactions will repopulate the ground states of $\alpha$ or $\alpha'$ (as seen in FIG. 8), but the light will still be on at the time that this occurs and will simply reexcite the system, giving it multiple changes to transfer properly. It is just required that the two light absorbing species (with absorbances at $\lambda_1$ and $\lambda_2$) have non-overlapping optical absorption bands to avoid multiple-cell shifts per light flash.

FIG. 8 describes this strategy. The solid arrows represent the optical excitations and electron transfer reactions in the proper directions. The dashed lines represent the wasteful recombination reactions which will not significantly decrease the device efficiency because of the possibility of re-excitation of the $\alpha$ or $\alpha'$ chromophores by the increased duration light pulse. The constraints on the duration of the light pulse described above are relaxed if a two-phase clock is used.

While six monomers are depicted in FIG. 8, the excitation using two different wavelengths may be accomplished with as few as four monomers—a donor monomer, two intermediate monomers, and an acceptor monomer. In this configuration, the donor monomer and the intermediate monomer adjacent the acceptor monomer are selected to have two states, with the upper state of the donor monomer being different than that of the intermediate monomer. Accordingly, $\lambda_1$ excites the donor and $\lambda_2$ excites the intermediate. This sequence is repeated and is used to move electrons down the chain.

It will be appreciated that more than two monomers having an upper state may be employed. In such a case, more than two excitation wavelengths would be required. Such configurations, while useful, may be unduly complex in light of present capabilities.

Thus, molecular systems for a molecular shift register based on transfer of a charged species (electron or hole) has been disclosed. It will be appreciated by those skilled in the art that various changes and modifications of an obvious nature may be made without departing from the spirit and scope of the invention, and all such changes and modifications are considered to fall within the scope of the invention as defined by the appended claims.

What is claimed is:

1. A composition for use in molecular shift registers comprising a polymer made up of at least three monomeric repeat units, each monomeric repeat unit comprising at least three different monomers, a first donor monomer, at least one intermediate monomer, and a final acceptor monomer, with one monomer having an energy level having a ground state and an upper state and all of the remaining monomers each having an energy level having a ground state only, said one monomer comprising a monomer selected from the group of donor, intermediate, and acceptor monomers, each said unit capable of transferring a charged species selected from the group of electrons and holes from one unit to a neighboring unit upon a single pulse of light, and each said unit having molecular orbitals that are selected from the group of predominantly filled with electrons or empty.

2. The composition of claim 1 wherein said repeat unit employs electrons as said charged species, said molecular orbitals are mostly unoccupied, and said shift is accomplished by donor excitation.

3. The composition of claim 2 wherein said repeat unit comprises said donor monomer, one intermediate monomer, and said acceptor monomer, with a first linker group between said donor and said intermediate, a second linker group between said intermediate and said acceptor, and a third linker group between said acceptor of one repeat unit and said donor of an adjacent repeat unit.

4. The composition of claim 3 wherein said donor monomer is a porphyrin complexed to a metal having two oxidation states, said intermediate monomer is a first quinone derivative, said acceptor is a second quinone derivative, and said first, second, and third linker groups are selected from the group consisting of 1,4-diphenyl and bicyclo[2.2.2]octane.

5. The composition of claim 4 wherein said first quinone derivative is benzoquinone and said second quinone derivative is 1,4-dichlorobenzoquinone.

6. The composition of claim 4 wherein said metal is selected from the group consisting of Zn and Pd.

7. The composition of claim 1 wherein said repeat unit comprises one intermediate monomer, employs holes as said charged species, said molecular orbitals are mostly filled, and said shift is accomplished by excitation of said intermediate monomer.

8. The composition of claim 7 wherein said repeat unit comprises said donor monomer, one intermediate monomer, and said acceptor monomer, with a first linker group between said acceptor of an adjacent repeat unit and said donor, a second linker group between said donor and said intermediate, a second linker group between said intermediate and said acceptor, and a third linker group between said acceptor of one repeat unit and said donor of an adjacent repeat unit.

9. The composition of claim 8 wherein said donor monomer is dimethyl aniline or a derivative thereof, said intermediate monomer is ruthenium tris(2,2'-bipyridine) or derivative thereof, said acceptor is methyl viologen or derivative thereof, said linker groups are each methylene or phenyl.

10. The composition of claim 2 wherein said repeat unit comprises said donor monomer, one intermediate monomer, and said acceptor monomer, with a linker group between said donor and said acceptor.

11. The composition of claim 10 wherein said donor monomer is an aromatic amine or diamine derivative, said intermediate monomer is an aromatic amine or diamine derivative, said acceptor is a ruthenium tris(2,2'-bipyridine) derivative, and said linker group is selected from the group consisting of phenyl and methylene.

12. A composition for use in molecular shift registers comprising a polymer made up of at least three monomeric repeat units, each monomeric repeat unit comprising at least three different monomers, a first donor monomer comprising a porphyrin complexed to a metal having two oxidation states, an intermediate monomer comprising a first quinone derivative, and a final acceptor monomer comprising a second quinone derivative, each said unit capable of transferring an electron from one unit to a neighboring unit upon a single pulse of light incident upon said donor monomer, and each said unit having molecular orbitals that are mostly unoccupied.

13. The composition of claim 12 further including a first linker group between said donor and said intermediate, a second linker group between said intermediate and said acceptor, and a third linker group between said acceptor of one repeat unit and said donor of an adjacent repeat unit.

14. The composition of claim 13 wherein said first, second, and third linker groups are selected from the group consisting of 1,4-diphenyl and bicyclo[2.2.2]octane.

15. The composition of claim 12 wherein said first quinone derivative is benzoquinone and said second quinone derivative is 1,4-dichlorobenzoquinone.

16. The composition of claim 12 wherein said metal is selected from the group consisting of Zn and Pd.

17. A composition for use in molecular shift registers comprising a polymer made up of at least three monomeric repeat units, each monomeric repeat unit comprising at least three different monomers, a first donor monomer comprising a dimethyl aniline or a derivative thereof, an intermediate monomer comprising ruthenium tris(2,2'-bipyridine) or derivative thereof, and a final acceptor monomer comprising methyl viologen or derivative thereof, each said unit capable of transferring a hole from one unit to a neighboring unit upon a single pulse of light incident upon said intermediate monomer, and each said unit having molecular orbitals that are mostly filled.

18. The composition of claim 17 further including a first linker group between said donor and said intermediate, a second linker group between said intermediate and said acceptor, and a third linker group between said acceptor of one repeat unit and said donor of an adjacent repeat unit.

19. The composition of claim 18 wherein said first, second, and third linker groups are selected from the group consisting of methylene and phenyl.

20. A composition for use in molecular shift registers comprising a polymer made up of at least three monomeric repeat units, each monomeric repeat unit comprising at least three different monomers, a first donor monomer comprising an aromatic amine or diamine derivative, an intermediate monomer comprising an aromatic amine or diamine derivative, and a final acceptor monomer comprising a ruthenium tris(2,2'-bipyridine) derivative, each said unit capable of transferring an electron from one unit to a neighboring unit upon a single pulse of light incident upon said donor monomer, and each said unit having molecular orbitals that are mostly unoccupied.

21. The composition of claim 20 further including a linker group between said donor and said acceptor.

22. The composition of claim 21 wherein said linker group is selected from the group consisting of methylene and phenyl.

* * * * *